United States Patent
Maru et al.

(10) Patent No.: US 12,130,159 B2
(45) Date of Patent: Oct. 29, 2024

(54) DETECTING AND ADAPTING TO CHANGES IN A RESONANT PHASE SENSING SYSTEM HAVING A RESISTIVE-INDUCTIVE-CAPACITIVE SENSOR

(71) Applicant: Cirrus Logic International Semiconductor Ltd., Edinburgh (GB)

(72) Inventors: Siddharth Maru, Austin, TX (US); Tejasvi Das, Austin, TX (US); Zhong You, Austin, TX (US); Johann G. Gaboriau, Austin, TX (US); Matthew Beardsworth, Austin, TX (US); Gregory C. Yancey, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 35 days.

(21) Appl. No.: 16/532,850

(22) Filed: Aug. 6, 2019

(65) Prior Publication Data
US 2020/0064160 A1 Feb. 27, 2020

Related U.S. Application Data

(60) Provisional application No. 62/721,134, filed on Aug. 22, 2018, provisional application No. 62/739,970, (Continued)

(51) Int. Cl.
*G01D 5/243* (2006.01)
*G01D 5/14* (2006.01)
(Continued)

(52) U.S. Cl.
CPC .............. *G01D 5/243* (2013.01); *G01D 5/14* (2013.01); *G01D 5/16* (2013.01); *G01D 5/20* (2013.01);
(Continued)

(58) Field of Classification Search
CPC . G01D 5/243; H03K 17/9522; H03K 17/9537
See application file for complete search history.

(56) References Cited

U.S. PATENT DOCUMENTS

| 4,268,822 A | 5/1981 | Olsen |
| 4,888,554 A | 12/1989 | Hyde et al. |
(Continued)

FOREIGN PATENT DOCUMENTS

| CN | 10542884 A1 | 3/2016 |
| CN | 106471708 A | 3/2017 |
(Continued)

OTHER PUBLICATIONS

International Search Report and Written Opinion of the International Searching Authority, International Application No. PCT/US2019/022518, mailed May 24, 2019.
(Continued)

*Primary Examiner* — Eman A Alkafawi
*Assistant Examiner* — Joseph O Nyamogo
(74) *Attorney, Agent, or Firm* — Jackson Walker L.L.P.

(57) ABSTRACT

A system may include a resistive-inductive-capacitive sensor, a measurement circuit communicatively coupled to the resistive-inductive-capacitive sensor, and a filter communicatively coupled to the measurement circuit. The measurement circuit may be configured to measure phase information associated with the resistive-inductive-capacitive sensor and based on the phase information, determine a displacement of a mechanical member relative to the resistive-inductive-capacitive sensor. The filter may be configured to isolate changes to the displacement which are significantly slower than an expected change to the displacement in response to a human interaction with the mechanical member.

21 Claims, 7 Drawing Sheets

Related U.S. Application Data filed on Oct. 2, 2018, provisional application No. 62/740,129, filed on Oct. 2, 2018.

(51) Int. Cl.
  *G01D 5/16* (2006.01)
  *G01D 5/20* (2006.01)
  *G01D 5/24* (2006.01)
  *G06F 3/01* (2006.01)
  *H03K 17/95* (2006.01)

(52) U.S. Cl.
  CPC ............ *G01D 5/24* (2013.01); *G06F 3/01* (2013.01); *H03K 17/9522* (2013.01); *H03K 17/9537* (2013.01)

(56) References Cited

U.S. PATENT DOCUMENTS

| | | |
|---|---|---|
| 5,286,941 A | 2/1994 | Bel |
| 5,361,184 A | 11/1994 | El-Sharkawi et al. |
| 5,567,920 A | 10/1996 | Watanabe et al. |
| 5,661,269 A | 8/1997 | Fukuzaki et al. |
| 5,715,529 A | 2/1998 | Kianush et al. |
| 5,898,136 A | 4/1999 | Katsurahira |
| 6,231,520 B1 | 5/2001 | Maezawa |
| 6,283,859 B1 | 9/2001 | Carlson et al. |
| 6,380,923 B1 | 4/2002 | Fukumoto et al. |
| 6,473,708 B1 | 10/2002 | Watkins et al. |
| 7,173,410 B1* | 2/2007 | Pond ............ H03K 17/9502 324/207.12 |
| 7,965,276 B1 | 6/2011 | Martin et al. |
| 8,144,126 B2 | 3/2012 | Wright |
| 8,174,352 B2 | 5/2012 | Parpia et al. |
| 8,346,487 B2 | 1/2013 | Wright et al. |
| 8,384,378 B2 | 2/2013 | Feldkamp et al. |
| 8,421,446 B2 | 4/2013 | Straubinger et al. |
| 8,428,889 B2 | 4/2013 | Wright |
| 8,457,915 B2 | 6/2013 | White et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,121,865 B2* | 9/2015 | Anagnost ............ G01P 15/005 |
| 9,164,605 B1 | 10/2015 | Pirogov et al. |
| 9,707,502 B1 | 7/2017 | Bonifas et al. |
| 10,168,855 B2 | 1/2019 | Baughman et al. |
| 10,372,328 B2 | 8/2019 | Zhai |
| 10,571,307 B2 | 2/2020 | Acker |
| 10,599,247 B2 | 3/2020 | Winokur et al. |
| 10,624,691 B2 | 4/2020 | Wiender et al. |
| 10,642,435 B2 | 5/2020 | Maru et al. |
| 10,726,715 B2 | 7/2020 | Hwang et al. |
| 10,795,518 B2 | 10/2020 | Kuan et al. |
| 10,860,202 B2 | 12/2020 | Sepehr et al. |
| 10,866,677 B2 | 12/2020 | Haraikawa |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,092,657 B2 | 8/2021 | Maru et al. |
| 11,093,060 B2 | 8/2021 | Yancey et al. |
| 11,204,670 B2 | 12/2021 | Maru et al. |
| 11,294,503 B2 | 4/2022 | Westerman |
| 11,474,135 B2 | 10/2022 | Maru et al. |
| 11,507,199 B2 | 11/2022 | Melanson |
| 11,537,242 B2 | 12/2022 | Das et al. |
| 11,579,030 B2 | 2/2023 | Li et al. |
| 11,644,370 B2 | 5/2023 | Marchais et al. |
| 2001/0045941 A1* | 11/2001 | Rosenberg ............ A63F 13/06 345/161 |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0047634 A1 | 3/2007 | Kang et al. |
| 2007/0080680 A1 | 4/2007 | Schroeder et al. |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2008/0312857 A1 | 12/2008 | Sequine |
| 2009/0008161 A1 | 1/2009 | Jones et al. |
| 2009/0009195 A1 | 1/2009 | Seguine |
| 2009/0058430 A1 | 3/2009 | Zhu |
| 2009/0140728 A1 | 6/2009 | Rollins et al. |
| 2009/0251216 A1 | 10/2009 | Giotta et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0114505 A1 | 5/2010 | Wang et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1* | 1/2014 | Potyrailo ............ G01R 35/005 324/601 |
| 2014/0137585 A1 | 5/2014 | Lu et al. |
| 2014/0225599 A1 | 8/2014 | Hess |
| 2014/0253107 A1 | 9/2014 | Roach et al. |
| 2014/0267065 A1 | 9/2014 | Levesque |
| 2014/0278173 A1 | 9/2014 | Elia et al. |
| 2015/0022174 A1 | 1/2015 | Nikitin |
| 2015/0027139 A1 | 1/2015 | Lin et al. |
| 2015/0077094 A1 | 3/2015 | Baldwin et al. |
| 2015/0084874 A1 | 3/2015 | Cheng et al. |
| 2015/0109243 A1 | 4/2015 | Jun et al. |
| 2015/0263686 A1* | 9/2015 | Lesso ............ H03M 1/0624 341/144 |
| 2015/0293695 A1 | 10/2015 | Schonleben et al. |
| 2015/0329199 A1 | 11/2015 | Golborne et al. |
| 2015/0355043 A1 | 12/2015 | Steeneken et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0231860 A1 | 8/2016 | Elia |
| 2016/0231874 A1 | 8/2016 | Baughman et al. |
| 2016/0241227 A1 | 8/2016 | Hirata |
| 2016/0252403 A1 | 9/2016 | Murakami |
| 2016/0305997 A1 | 10/2016 | Wiesbauer et al. |
| 2016/0357296 A1 | 12/2016 | Picciotto et al. |
| 2017/0023429 A1 | 1/2017 | Straeussnigg et al. |
| 2017/0077735 A1 | 3/2017 | Leabman |
| 2017/0093222 A1 | 3/2017 | Joye et al. |

(56) References Cited

U.S. PATENT DOCUMENTS

| | | |
|---|---|---|
| 2017/0097437 A1 | 4/2017 | Widmer et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0169674 A1 | 6/2017 | Macours |
| 2017/0184416 A1 | 6/2017 | Kohlenberg et al. |
| 2017/0185173 A1* | 6/2017 | Ito .................. G06F 3/03545 |
| 2017/0187541 A1 | 6/2017 | Sundaresan et al. |
| 2017/0237293 A1 | 8/2017 | Faraone et al. |
| 2017/0242505 A1 | 8/2017 | Vandermeijden et al. |
| 2017/0282715 A1 | 10/2017 | Fung et al. |
| 2017/0315653 A1 | 11/2017 | Vandermeijden et al. |
| 2017/0322643 A1 | 11/2017 | Eguchi |
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0020288 A1 | 1/2018 | Risbo et al. |
| 2018/0039331 A1* | 2/2018 | Warren .................. G06F 3/043 |
| 2018/0055448 A1 | 3/2018 | Karakaya et al. |
| 2018/0059793 A1* | 3/2018 | Hajati .................. H02K 33/02 |
| 2018/0067601 A1 | 3/2018 | Winokur et al. |
| 2018/0088064 A1 | 3/2018 | Potyrailo et al. |
| 2018/0088702 A1 | 3/2018 | Schutzberg et al. |
| 2018/0097475 A1 | 4/2018 | Djahanshahi et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0189647 A1 | 7/2018 | Calvo et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0294757 A1 | 10/2018 | Feng et al. |
| 2018/0321748 A1 | 11/2018 | Rao et al. |
| 2018/0364731 A1 | 12/2018 | Liu et al. |
| 2019/0052045 A1 | 2/2019 | Metzger et al. |
| 2019/0179146 A1 | 6/2019 | De Nardi |
| 2019/0197218 A1 | 6/2019 | Schwartz |
| 2019/0204929 A1 | 7/2019 | Attari et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0064952 A1 | 1/2020 | Siemieniec et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardsworth et al. |
| 2020/0386804 A1 | 12/2020 | Das et al. |
| 2021/0064137 A1 | 3/2021 | Wopat et al. |
| 2021/0140797 A1 | 5/2021 | Kost et al. |
| 2021/0149538 A1 | 5/2021 | LaPointe et al. |
| 2021/0152174 A1 | 5/2021 | Yancey et al. |
| 2021/0361940 A1 | 11/2021 | Yeh et al. |
| 2021/0396610 A1 | 12/2021 | Li et al. |
| 2021/0404901 A1 | 12/2021 | Kost et al. |
| 2021/0405764 A1 | 12/2021 | Hellman |
| 2022/0075500 A1 | 3/2022 | Chang et al. |
| 2022/0268233 A1 | 8/2022 | Kennedy et al. |
| 2022/0307867 A1 | 9/2022 | Das et al. |
| 2022/0308000 A1 | 9/2022 | Das et al. |
| 2022/0404409 A1 | 12/2022 | Maru et al. |

FOREIGN PATENT DOCUMENTS

| | | | | |
|---|---|---|---|---|
| CN | 107076623 | A | 8/2017 | |
| CN | 209069345 | U | 7/2019 | |
| CN | 110609610 | A | 12/2019 | |
| DE | 4004450 | A1 | 8/1991 | |
| DE | 602004005672 | T2 | 12/2007 | |
| DE | 102015215330 | A1 | 2/2017 | |
| DE | 102015215331 | A1 | 2/2017 | |
| EP | 1697710 | B1 | 4/2007 | |
| EP | 2682843 | A1 | 1/2014 | |
| GB | 2394295 | A | 4/2004 | |
| GB | 2573644 | A | 11/2019 | |
| GB | 2582065 | A | 9/2020 | |
| GB | 2582864 | A | 10/2020 | |
| GB | 2586722 | B | 2/2022 | |
| JP | 2006246289 | A | 9/2006 | |
| KR | 20130052059 | A1 | 5/2013 | |
| WO | WO-0033244 | A2 * | 6/2000 | .......... G01D 5/2073 |
| WO | 20061354832 | A2 | 12/2006 | |
| WO | 2007068283 | A1 | 6/2007 | |
| WO | 2016027034 | A1 | 3/2016 | |
| WO | 2021101722 | A1 | 5/2021 | |
| WO | 2021101723 | A1 | 5/2021 | |

OTHER PUBLICATIONS

International Search Report and Written Opinion of the International Searching Authority, International Application No. PCT/US2019/022578, mailed May 27, 2019.
International Search Report and Written Opinion of the International Searching Authority, International Application No. PCT/US2019/021838, mailed May 27, 2019.
Combined Search and Examination Report under Sections 17 and 18(3), UKIPO, Application No. GB2001341.3, mailed Jun. 29, 2020.
International Search Report and Written Opinion of the International Searching Authority, International Application No. PCT/US2019/045554, mailed Oct. 17, 2019.
Combined Search and Examination Report, UKIPO, Application No. GB1904250.6, mailed Sep. 10, 2019.
International Search Report and Written Opinion of the International Searching Authority, International Application No. PCT/US2020/059113, mailed Feb. 23, 2021.
International Search Report and Written Opinion of the International Searching Authority, International Application No. PCT/US2020/059101, mailed Mar. 9, 2021.
First Office Action, China National Intellectual Property Administration, Application No. 201980022689.9, issued Jun. 2, 2021.
First Office Action, China National Intellectual Property Administration, Application No. 201980022693.5, issued Jul. 8, 2021.
International Search Report and Written Opinion of the International Searching Authority, International Application No. PCT/US2021/035695, mailed Sep. 9, 2021.
Second Office Action, China National Intellectual Property Administration, Application No. 201980022689.9, mailed Oct. 27, 2021.
Second Office Action, China National Intellectual Property Administration, Application No. 201980022693.5, mailed Dec. 14, 2021.
Combined Search and Examination Report under Sections 17 and 18(3), UKIPO, Application No. GB2111666.0, mailed Feb. 11, 2022.
Examination Report under Section 18(3), UKIPO, Application No. GB2101804.9, mailed Feb. 25, 2022.
International Search Report and Written Opinion of the International Searching Authority, International Application No. PCT/US2022/012721, mailed Apr. 26, 2022.
International Search Report and Written Opinion of the International Searching Authority, International Application No. PCT/US2022/018475, mailed Aug. 2, 2022.

(56) References Cited

OTHER PUBLICATIONS

Notice of Preliminary Rejection, Korean Intellectual Property Office, Application No. 10-2020-7029597, mailed Jul. 29, 2022.
Second Office Action, China National Intellectual Property Administration, Application No. 201980022693.5, issued Apr. 13, 2022.
Examination Report, UKIPO, Application No. GB2015439.9, mailed May 10, 2022.
International Search Report and Written Opinion of the International Searching Authority, International Application No. PCT/US2022/018886, mailed Jun. 10, 2022.
Combined Search and Examination Report, UKIPO, Application No. GB2201194.4, mailed Jul. 1, 2022.
First Office Action, China National Intellectual Property Administration, Application No. 202010105829.3, issued Apr. 12, 2022, received by counsel Jul. 28, 2022.
Combined Search and Examination Report under Sections 17 and 18(3), United Kingdom Intellectual Property Office, Application No. GB2215005.6, mailed Apr. 11, 2023.
Gao, Shuo, et al., Piezoelectric vs. Capactivie Based Force Sensing in Capacitive Touch Panels, IEEE Access, vol. 4, Jul. 14, 2016.
First Office Action, China National Intellectual Property Administration, Application No. 202080080853.4, issued Feb. 22, 2023.
Second Office Action, China National Intellectual Property Administration, Application No. 201980054799.3, issued May 24, 2023.
First Office Action, China Intellectual Property Administration, Application No. 202180043659.3, issued Sep. 8, 2023.
Combined Search and Examination Report, United Kingdom Intellectual Property Office, Application No. GB2313599.9, mailed Oct. 9, 2023.

\* cited by examiner

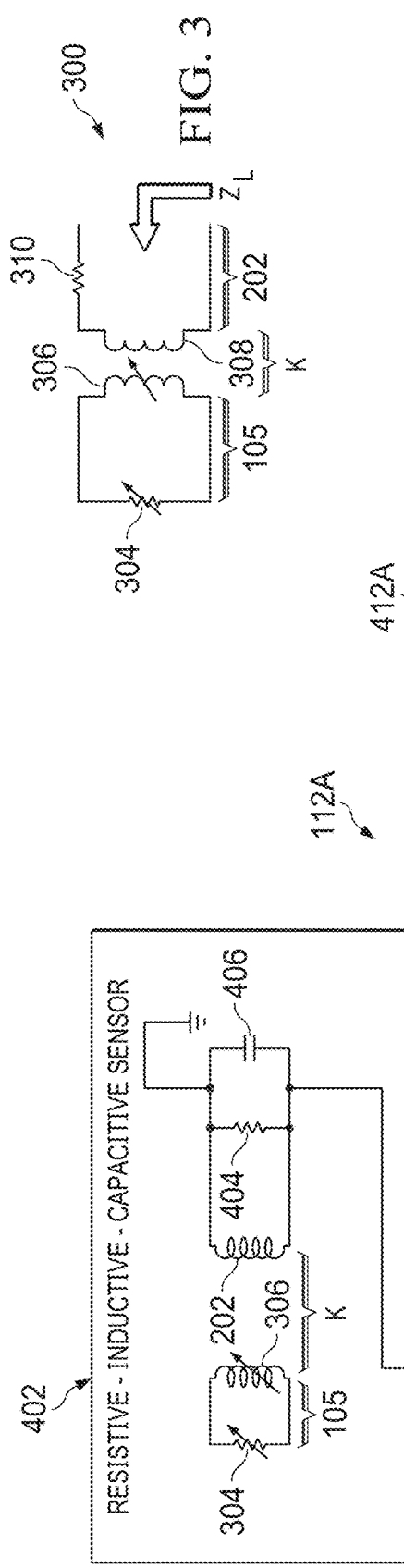
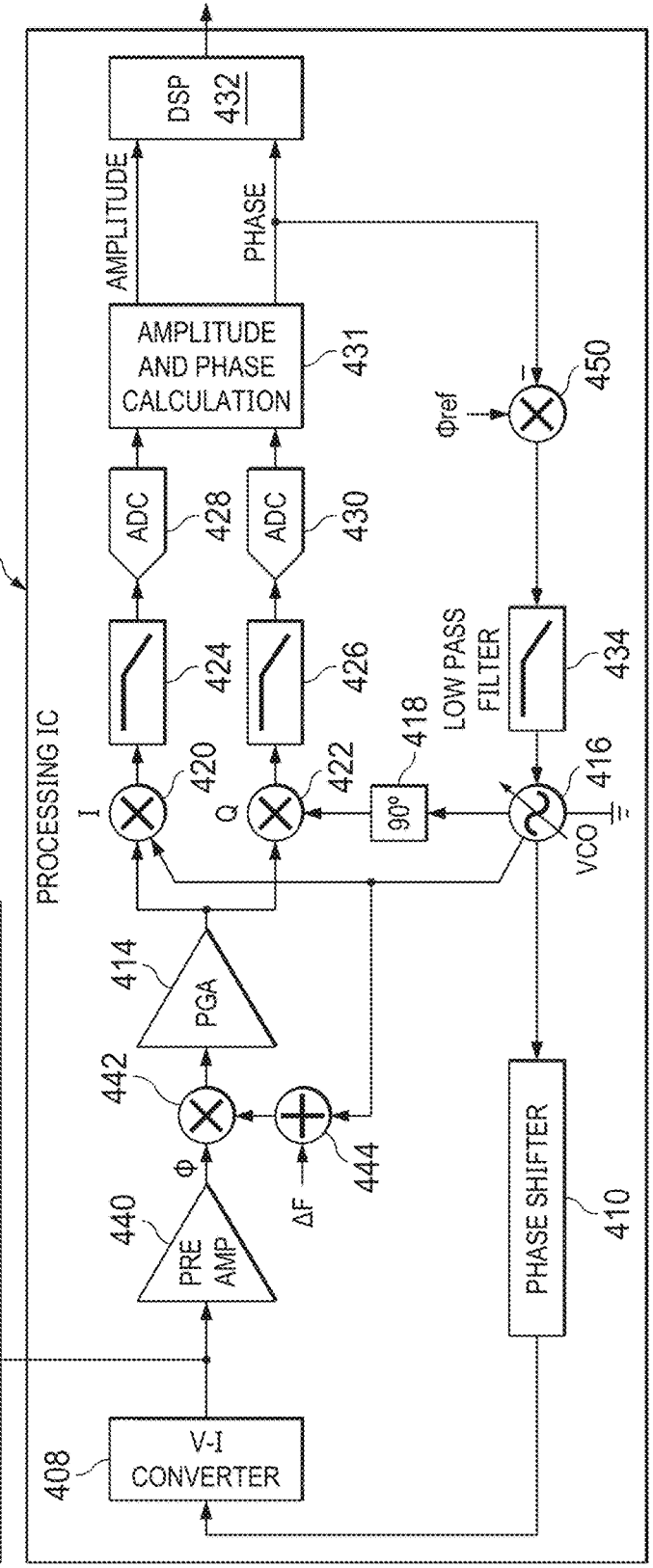
FIG. 3
FIG. 4A

DETECTING AND ADAPTING TO CHANGES IN A RESONANT PHASE SENSING SYSTEM HAVING A RESISTIVE-INDUCTIVE-CAPACITIVE SENSOR

RELATED APPLICATION

The present disclosure claims priority to U.S. Provisional Patent Application Ser. No. 62/739,970, filed Oct. 2, 2018, U.S. Provisional Patent Application Ser. No. 62/721,134, filed Aug. 22, 2018, and U.S. Provisional Patent Application Ser. No. 62/740,129, filed Oct. 2, 2018, all of which are incorporated by reference herein in their entireties. This application is also related to U.S. Provisional Patent Application Ser. No. 62/649,857, filed Mar. 29, 2018, and all of its children applications, all of which are incorporated by reference herein in their entireties.

FIELD OF DISCLOSURE

The present disclosure relates in general to electronic devices with user interfaces (e.g., mobile devices, game controllers, instrument panels for vehicles, machinery, and/or appliances, etc.), and more particularly, to resonant phase sensing of resistive-inductive-capacitive sensors for use in a system for mechanical button replacement in a mobile device and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, because such mechanical buttons are susceptible to aging, wear, and tear that may reduce the useful life of a mobile device and/or may require significant repair if malfunction occurs, mobile device manufacturers are increasingly looking to equip mobile devices with virtual buttons that act as a human-machine interface allowing for interaction between a user of a mobile device and the mobile device itself. Ideally, for best user experience, such virtual buttons should look and feel to a user as if a mechanical button were present instead of a virtual button.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include a resistive-inductive-capacitive sensor, a measurement circuit communicatively coupled to the resistive-inductive-capacitive sensor, and a filter communicatively coupled to the measurement circuit. The measurement circuit may be configured to measure phase information associated with the resistive-inductive-capacitive sensor and based on the phase information, determine a displacement of a mechanical member relative to the resistive-inductive-capacitive sensor. The filter may be configured to isolate changes to the displacement which are significantly slower than an expected change to the displacement in response to a human interaction with the mechanical member.

In accordance with these and other embodiments of the present disclosure, a method may include measuring phase information associated with a resistive-inductive-capacitive sensor, determining a displacement of a mechanical member relative to the resistive-inductive-capacitive sensor based on the phase information, and isolating, with a filter, changes to the displacement which are significantly slower than an expected change to the displacement in response to a human interaction with the mechanical member.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates selected components of an inductive sensing system that may be implemented by a resonant phase sensing system, in accordance with embodiments of the present disclosure;

Figure 4B:
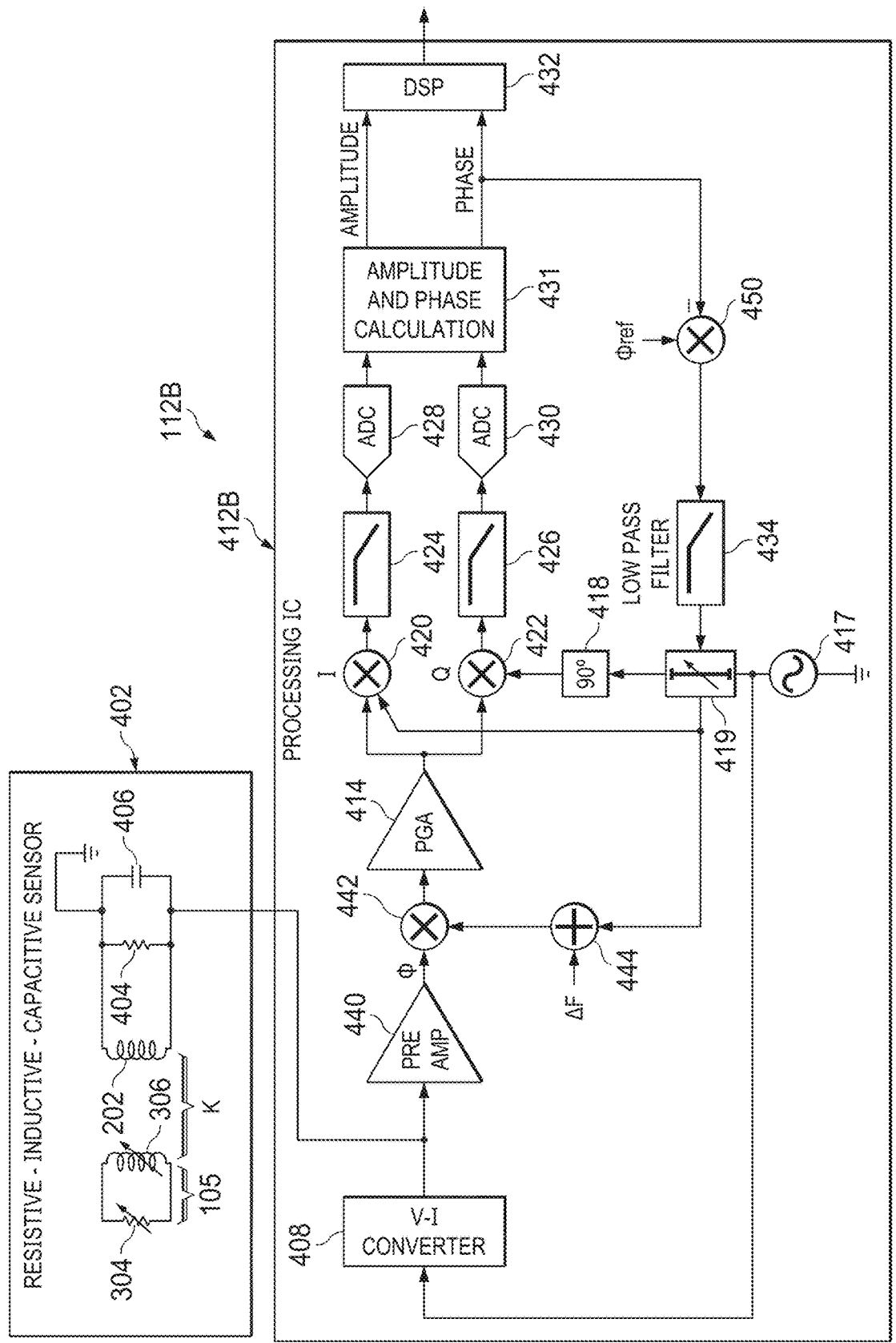
Figure 4C:
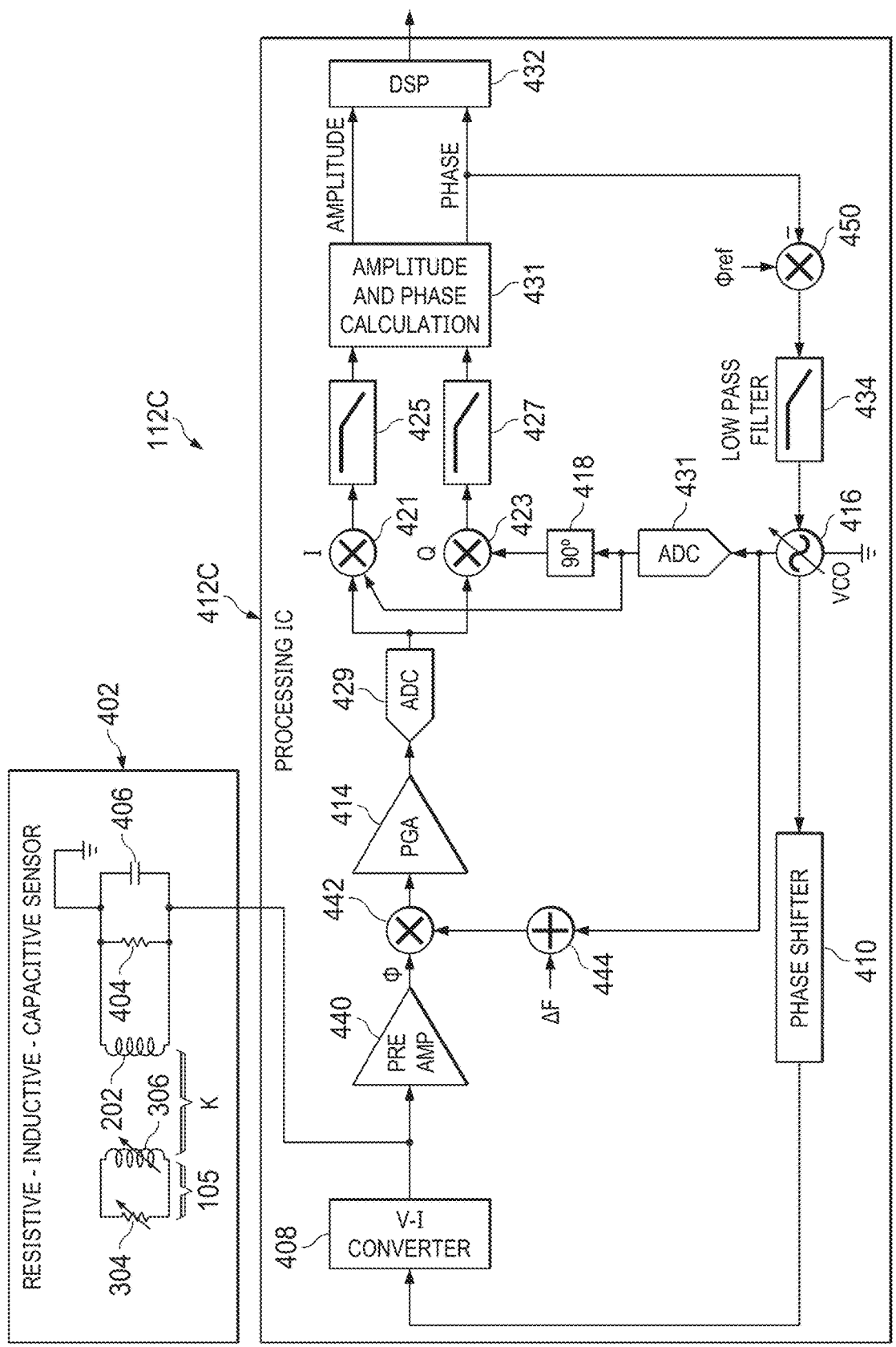
Figure 5:
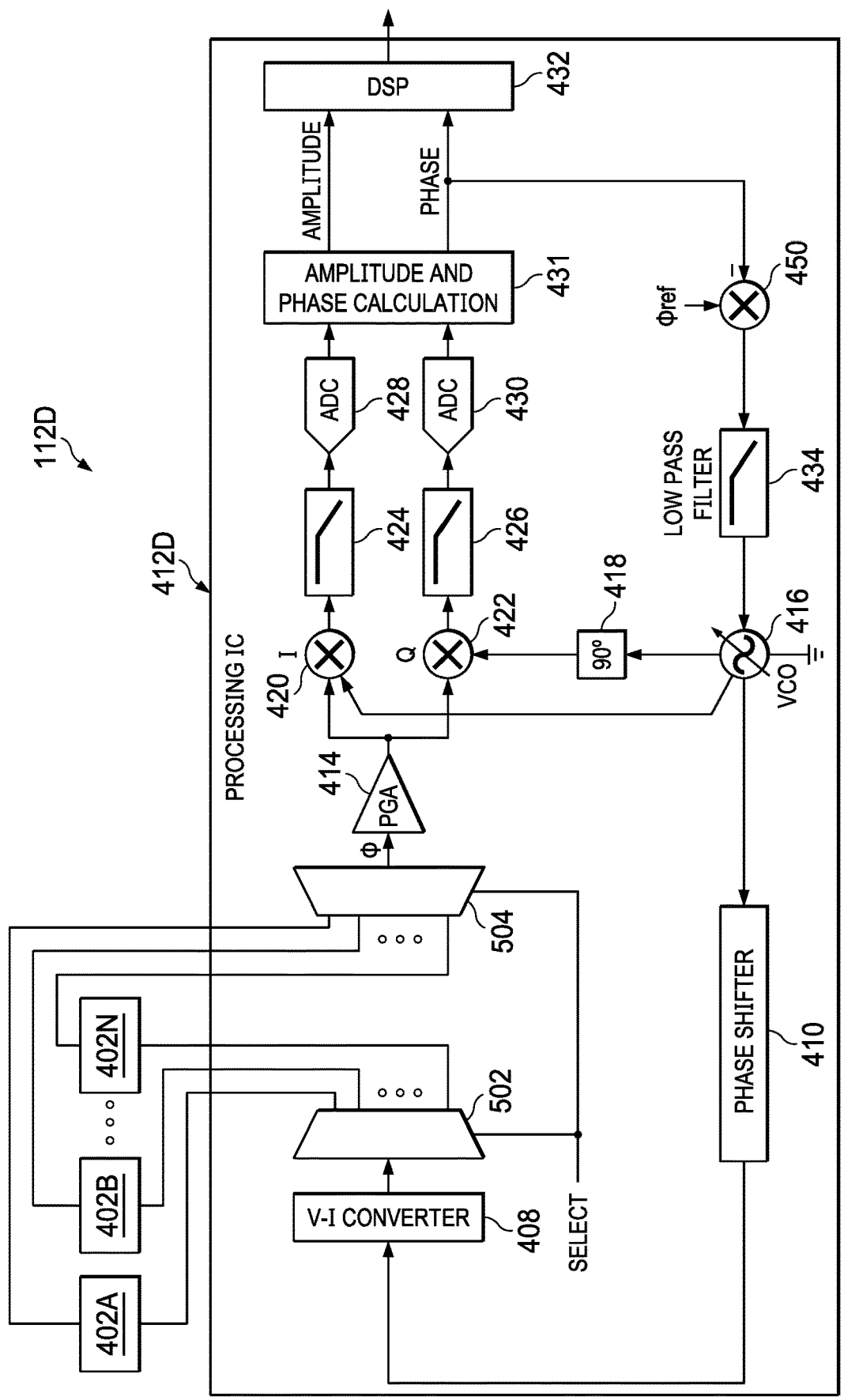
Figure 6:
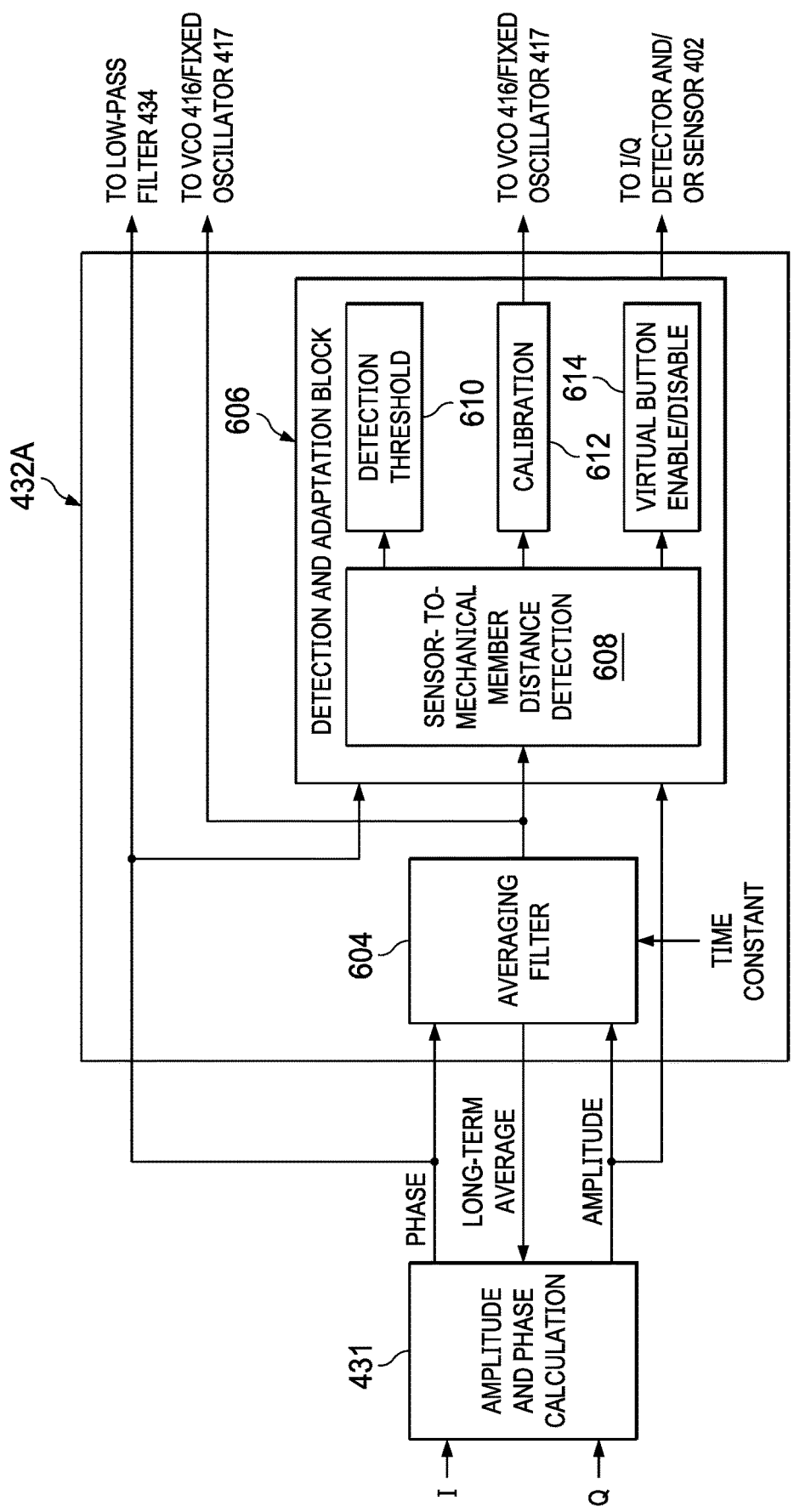
Figure 7:
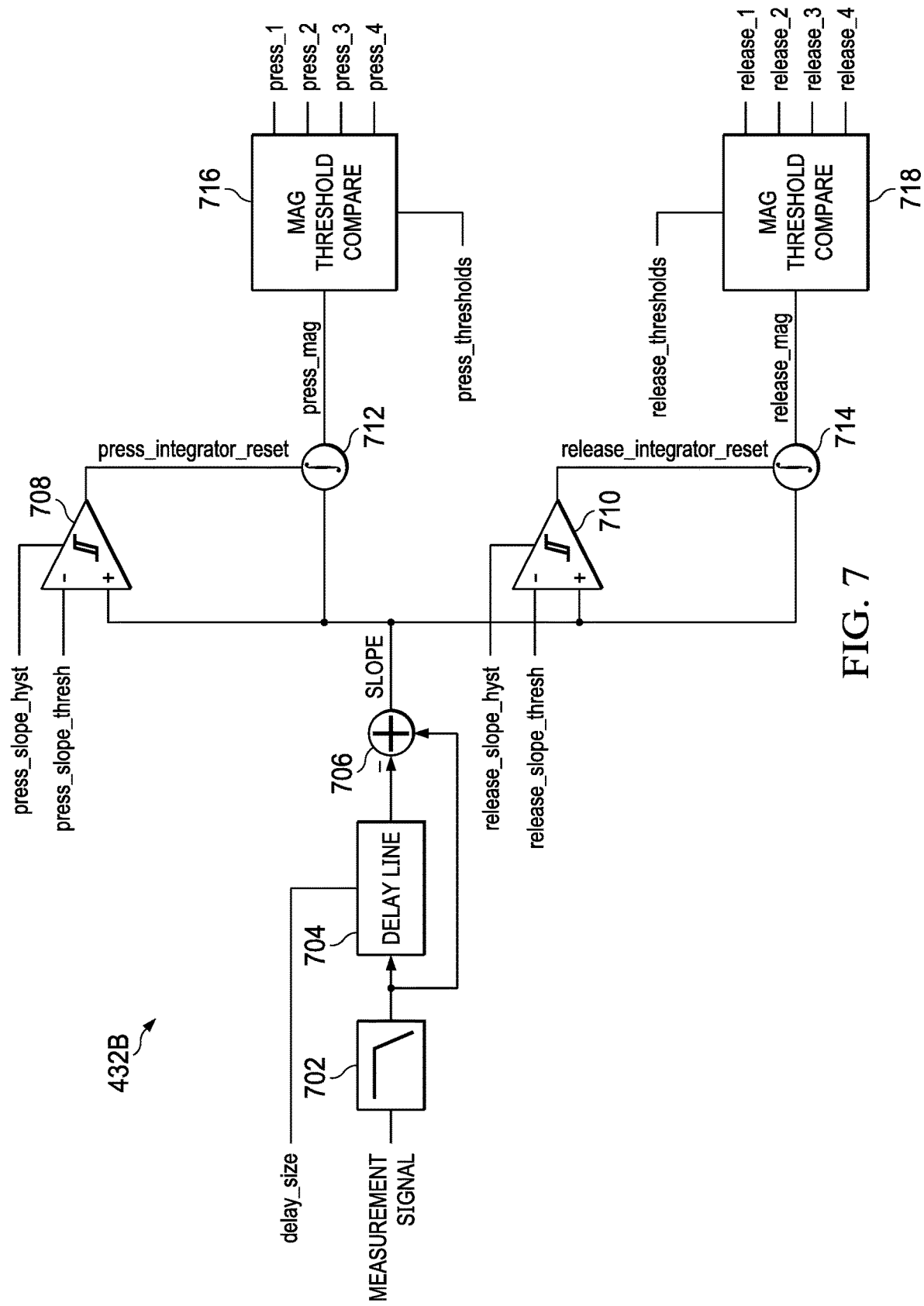

Each of FIGS. 4A-4C illustrates a diagram of selected components of an example resonant phase sensing system, in accordance with embodiments of the present disclosure;

FIG. 5 illustrates a diagram of selected components of an example resonant phase sensing system implementing time-division multiplexed processing of multiple resistive-inductive-capacitive sensors, in accordance with embodiments of the present disclosure;

FIG. 6 illustrates a diagram of an amplitude and phase calculation block and selected functional components of an example digital signal processor, in accordance with embodiments of the present disclosure; and FIG. 7 illustrates a diagram of selected functional components of another example digital signal processor, in accordance with embodiments of the present disclosure.

DETAILED DESCRIPTION

Figure 1:
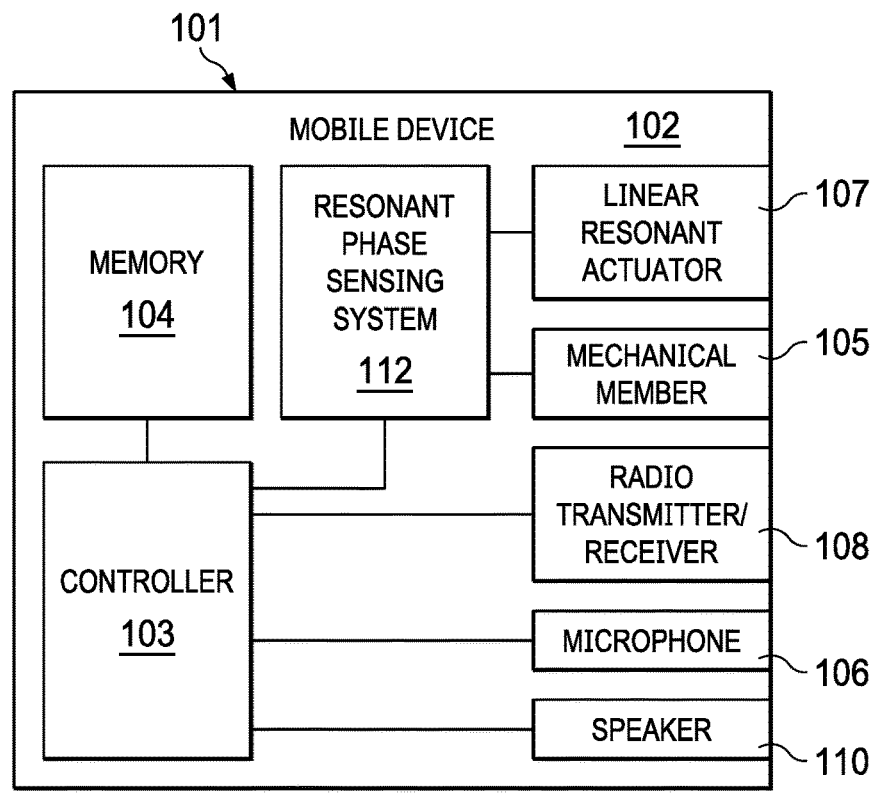
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual button, which, to a user of mobile device 102, has a look and feel of a mechanical button of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual button of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual buttons each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Figure 2:
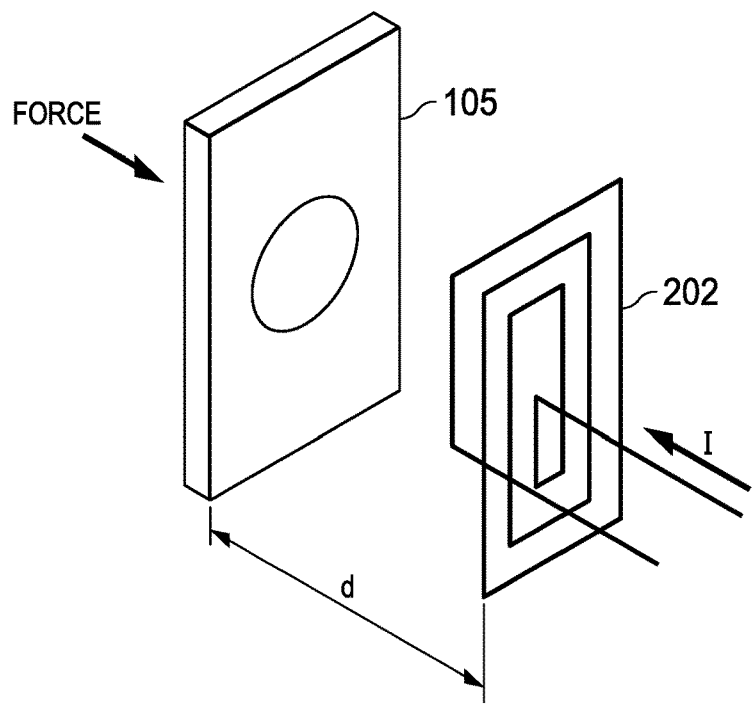
FIG. 2 illustrates a mechanical member separated by a distance from an inductive coil, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of an inductive sensing system 300 that may be implemented by resonant phase sensing system 112, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown in FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal φ generated by pre-amplifier 440 is approximately equal to a quadrature component of sensor signal φ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal φ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal φ and condition sensor signal φ for frequency mixing, with mixer 442, sensor signal φ to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal 4 directly from resistive-inductive-capacitive sensor 402. However, when present, preamplifier 440, mixer 442, and combiner 444 may allow for mixing sensor signal φ down to a lower frequency intermediate frequency Δf which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal φ to condition sensor signal φ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal φ. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal 4, low-pass filter 424 may filter out the oscillation signal mixed with the amplified sensor signal φ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal φ, low-pass filter 426 may filter out the phase-shifted oscillation signal mixed with the amplified sensor signal φ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal φ towards reference phase $\phi_{ref}$. As a result, sensor signal φ may comprise a transient decaying signal in response to a "press" of a virtual button associated with resonant phase sensing system 112A as well as another transient decaying signal in response to a subsequent "release" of the virtual button. Accordingly, low-pass filter 434 in connection with VCO 416 may implement a feedback control loop that may track changes in operating parameters of resonant phase sensing system 112A by modifying the driving frequency of VCO 416.

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown in FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal φ towards indicating a phase shift of zero. As a result, sensor signal φ may comprise a transient decaying signal in response to a "press" of a virtual button associated with resonant phase sensing system 112B as well as another transient decaying signal in response to a subsequent "release" of the virtual button. Accordingly, low-pass filter 434 in connection with variable phase shifter 419 may implement a feedback control loop that may track changes in operating parameters of resonant phase sensing system 112B by modifying the phase shift applied by variable phase shifter 419.

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 and ADC 431 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT (which may be controlled by a time-division multiplexing control subsystem implemented by controller 103 or another suitable component of mobile device 102). Thus, while in some embodiments a device such as mobile device 102 may comprise a plurality of resistive-inductive-capacitive sensors 402 which may be simultaneously driven and separately processed by a respective processing IC, in other embodiments a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, when a first resistive-inductive-capacitive sensor (e.g., resistive-inductive-capacitive sensor 402A) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors 402B-402N) may each be placed in a low-impedance state. Similarly, when a second resistive-inductive-capacitive sensor (e.g., resistive-inductive-capacitive sensor 402B) is selected by the time-division multiplexing control subsystem for being driven by voltage-to-current converter 408 and measured by the measurement circuit implemented by processing IC 412A, other resistive-inductive-capacitive sensors (e.g., resistive-inductive-capacitive sensors other than 402B, including 402A) may each be placed in a low-impedance state. Such an approach may minimize power consumption within unselected resistive-inductive-capacitive sensors 402.

A similar approach may also be used in a resonant phase sensing system having only a single resistive-inductive-capacitive sensor 402 in order to reduce power consumption associated with such sensor. For example, instead of time-division multiplexing among multiple sensors, a single resistive-inductive-capacitive sensor 402 may be duty-cycled in operation such that, for a first portion of a cycle of a measurement circuit (e.g., processing IC 412A), the measurement circuit may operate in a low power mode, and, for a second portion of the cycle of the measurement circuit, the measurement circuit may operate in a high power mode in which the measurement circuit consumes more power than in the low power mode, and wherein the measurement circuit performs measurement of the phase information and determination of the displacement of a mechanical member (e.g., mechanical member 105) during the second portion.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

Although resonant phase sensing system 112 as described above may provide an effective approach to sensing human interaction with a virtual button on a device (e.g., mobile device 102), a variety of factors could negatively affect sensitivity and accuracy of resonant phase sensing system 112 which could, if not compensated or corrected, lead to false detection of human interaction. For example, wear, misuse (whether intended or unintended), material expansion and contraction, and variations in temperature, may lead to damage, deformities, and/or other physical changes to mechanical member 105 which may lead to unintended changes to a distance between mechanical member 105 and resonant phase sense system 112, wherein such changes are caused by factors other than human interaction with mechanical member 105. Such unintended changes to the distance may lead to false detection of transient displacement events indicative of human interaction, as well as permanent loss of functionality of resonant phase sensing system 112 or a resistive-inductive-capacitive sensor 402 integral to resonant phase sensing system 112.

FIG. 6 illustrates a diagram of amplitude and phase calculation block 431 and selected functional components of an example digital signal processor 432A, in accordance with embodiments of the present disclosure. In some embodiments, digital signal processor 432A may implement DSP 432 described above. As described in greater detail below, DSP 432A may be configured to detect and adapt to changes in resonant phase sensing system 112, particularly those caused by unintended displacement of mechanical member 105, as is described in greater detail below.

As shown in FIG. 6, DSP 432A may include an averaging filter 604, and a detection and adaptation block 606. As described previously, amplitude and phase calculation block 431 may receive the incident component I and the quadrature component Q as generated by the coherent incident/quadrature detector of a processing IC 412, and from the incident component I and the quadrature component Q, generate signals indicative of a phase and an amplitude associated with resistive-inductive-capacitive sensor 402. Averaging filter 604 may comprise any suitable averaging filter as is known in the art and may be configured to isolate changes to the displacement of mechanical member 105 relative to resistive-inductive-capacitive sensor 402 which are significantly slower than an expected change to the displacement in response to a human interaction with mechanical member 105. Such detection and isolation of changes to the displacement which are significantly slower than the expected change to the displacement may be used in order to distinguish between false human interactions with the mechanical member and actual human interactions with the mechanical member and/or to determine a permanent loss of functionality of the ability of the resistive-inductive-capacitive sensor to detect the displacement. In order to detect and isolate changes to the displacement which are significantly slower than the expected change to the displacement, averaging filter 604 may have a filter time constant (shown in FIG. 6 as being set by a signal TIME CONSTANT) which is significantly larger than an expected time of an actual human interaction with mechanical member 105. In some embodiments, such filter time constant may be programmable responsive to a stimulus external to resonant phase sensing system 112. For example, the time constant may be programmable based on how a virtual button/human-machine interface is used (e.g., different time constants for an interaction with a virtual power button, an interaction with a virtual volume button to control volume, and an interaction with a virtual volume button to initiate a secondary action, such as screen capture). In these and other embodiments, such filter time constant may be based on a historical output of the measurement circuit (e.g., the coherent incident/quadrature detector) of processing IC 412. For example, historical button press data of a user may be used to set time constants that differentiate a true interaction with a virtual button from a false interaction with a virtual button.

Although the foregoing contemplates use of an averaging filter (averaging filter 604), any other suitable low-pass filter may be used to detect and isolate changes to the displacement which are significantly slower than the expected change to the displacement.

Detection and adaptation block 606 may receive the filtered signal generated by averaging filter 604, the phase signal generated by amplitude and phase calculation block 431, and the amplitude signal generated by amplitude and phase calculation block 431. Detection and adaptation block 606 may implement a control circuit configured to, based on at least the filtered signal generated by averaging filter 604, determine whether changes have occurred to the displacement of mechanical member 105 relative to resistive-inductive-capacitive sensor 402 which are significantly slower than an expected change to the displacement in response to a human interaction with mechanical member 105 (e.g., using sensor-to-mechanical member distance detection block 608), and responsive to determining that such changes have occurred, may perform one or more remedial actions. For example, through interaction with virtual button enable/disable block 614, detection and adaptation block 606 may disable sensing of interaction of mechanical member 105 with resistive-inductive-capacitive sensor 402, thus disabling a virtual button associated with resistive-inductive-capacitive sensor 402. As another example, through interaction with virtual button enable/disable block 614, detection and adaptation block 606 may re-assign functionality of a resistive-inductive-capacitive sensor 402 to another sensor (e.g., another resistive-inductive-capacitive sensor 402) for detecting human interaction. As a particular example, in operation of resonant phase sensing system 112D of FIG. 5, some but not all of resistive-inductive-capacitive sensors 402 may be enabled and in use. However, if during time-division multiplexed phases for a particular resistive-inductive-capacitive sensor 402, detection and adaptation block 606 determines that the particular resistive-inductive-capacitive sensor 402 is not properly functioning based on a distance measurement as indicated by averaging filter 604, detection and adaptation block 606 may disable such resistive-inductive-capacitive sensor 402 (e.g., by causing the time-division multiplexed phases for such resistive-inductive-capacitive sensor 402 to be eliminated) and enable another resistive-inductive-capacitive sensor 402, which in effect may enable another virtual button to take on the functionality of the disabled resistive-inductive-capacitive sensor 402 and its associated virtual button.

As yet another example of a remedial action, through interaction with detection thresholds block 610, detection and adaptation block 606 may modify one or more phase detection/distance thresholds for indicating a human interaction with mechanical member 105. Thus, should the distance between mechanical member 105 and resistive-inductive-capacitive sensor 402 slowly drift over time, phase detection/distance thresholds for indicating a human interaction with mechanical member 105 may be modified to reduce or eliminate false detections.

As a further example of a remedial action, detection and adaptation block 606 may modify a quality factor or Q factor associated with resistive-inductive-capacitive sensor 402. Such modification or Q factor may be performed by modifying an impedance (e.g., resistance, inductance, and/or capacitance) of resistive-inductive-capacitive sensor 402, which may have the effect of altering the resonant frequency and/or measured phase associated with resistive-inductive-capacitive sensor 402, in order to compensate for slow drifting of the distance between mechanical member 105 and resistive-inductive-capacitive sensor 402 over time, which may also reduce or eliminate false detections.

As an additional example of a remedial action, through calibration block 612, detection and adaptation block 606 may modify a driving frequency at which resistive-inductive-capacitive sensor 402 is driven by VCO 416 (or fixed oscillator 417). Such modification may have the effect of altering the measured phase associated with resistive-inductive-capacitive sensor 402, in order to compensate for slow drifting of the distance between mechanical member 105 and resistive-inductive-capacitive sensor 402 over time, which may also reduce or eliminate false detections. In some embodiments, the output of calibration block 612 and/or averaging filter 604 may be combined with an output of a loop filter (e.g., low-pass filter 434) integral to the measurement circuit of resonant phase sensing system 112 to compensate for measurement signal phase shifts occurring responsive to slow changes in the displacement over time.

As a further example of a remedial action, detection and adaptation block 606 may modify a measurement sensitivity of the measurement circuit implemented by the coherent incident/quadrature detector of resonant phase sensing system 112. A drift in distance may reduce sensitivity of resonant phase sensing system 112 (e.g., the amount of phase measured for a button press). Such sensitivity may be increased by increased power consumption to resonant phase sensing system 112, which may reduce a noise floor of one or more component elements of resonant phase sensing system 112.

As another example of a remedial action, detection and adaptation block 606 may modify a phase measurement algorithm of the measurement circuit of resonant phase sensing system 112. As a specific example, the phase measurement algorithm may be modified so as to change the amount, slope, or time of a phase deviation that is considered to be an interaction with a virtual button.

As a further example of a remedial action, detection and adaptation block 606 may modify one or more calibration parameters of the measurement circuit of resonant phase sensing system 112. As a specific example, one of the calibrations performed in resonant phase sensing system 112 is a calculation of a quiescent phase value that serves as a reference for interaction with a virtual button. This reference value may vary due to a drift in distance or displacement.

FIG. 6 contemplates the use of a level-based detection mechanism which may require some version of baseline tracking that provides a meaningful steady-state reference to compare against. However, in some embodiments, a slope-based detection mechanism may be employed. FIG. 7 illustrates a diagram of selected functional components of example digital signal processor 432B, in accordance with embodiments of the present disclosure. In some embodiments, digital signal processor 432B may implement DSP 432 described above. As described in greater detail below, DSP 432B may be configured to detect and adapt to changes in resonant phase sensing system 112, particularly those caused by unintended displacement of mechanical member 105, as is described in greater detail below.

As its name implies, the slope-based approach of FIG. 7 may classify events based off a slope of measured phase and/or amplitude signals, and thus may be designed to naturally reject slow-moving signals that are out of the band in interest. A slope-based approach also does not preclude use of phase data directly to help refine its judgements.

As shown in FIG. 1, a sample of a measured signal (e.g., phase or amplitude) may be filtered by a low-pass filter 702, delayed by a delay line 704, and subtracted by combiner 706 from a later sample of the measured signal, in order to generate a slope signal indicative of a time rate of change of the measured signal.

The slope signal may be compared to one or more thresholds (e.g., a threshold press_slope_thresh for button presses and a threshold release_slope_thresh for button releases) at comparators 708 and 710, wherein one or more of such thresholds may be programmable. By subjecting the determined slope to such thresholds, slow drifts in signal may be filtered out, much like a noise gate. These gated signals may be received by integrators 712 and 714, which may measure the magnitude (e.g., press_mag, release_mag) of the change in the measured signal. Such magnitude may be used directly or compared (e.g., by comparators 716 and 718) against programmable thresholds (e.g., press_thresholds, release_thresholds) to enable further functionality, such as event triggering.

The range of input slopes to be ignored may be related to the length of delay line 704 (e.g., as set by variable delay_size) slope thresholds press_slope_thresh and release_slope_thresh, and sampling rate.

Although the foregoing contemplates use of closed-loop feedback for sensing of displacement, the various embodiments represented by FIGS. 4A-7 may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a resistive-inductive-capacitive sensor;
   a measurement circuit communicatively coupled to the resistive-inductive-capacitive sensor and configured to:
      generate a voltage oscillation signal;
      phase shift the voltage oscillation signal; convert the phase shifted voltage oscillation signal to a current signal;
      drive the resistive-inductive-capacitive sensor with the current signal;
      measure phase information associated with the resistive-inductive-capacitive sensor being driven by the current signal; and
      based on the phase information, determine a displacement of a mechanical member relative to the resistive-inductive-capacitive sensor, wherein the mechanical member is disposed within a planar region, and wherein the displacement is a displacement along an axis perpendicular to the planar region; and
   a filter communicatively coupled to the measurement circuit, wherein a filter time constant of the filter is larger than a predetermined reference time, such that the filter is configured to isolate changes to the displacement which are slower than the predetermined reference time, and wherein the filter time constant is programmable based on an external stimulus such that different filter time constants are associated with different functionalities for the mechanical member, wherein a first filter time constant is associated with actuating a virtual power button, and wherein a second filter time constant is associated with actuating a different virtual button.

2. The system of claim 1, wherein the filter is configured to isolate the changes to the displacement which are slower than the predetermined reference time to distinguish between false human interactions with the mechanical member and actual human interactions with the mechanical member.

3. The system of claim 1, wherein the filter is configured to isolate the changes to the displacement which are slower than the predetermined reference time to determine a permanent loss of functionality of the ability of the resistive-inductive-capacitive sensor to detect the displacement.

4. The system of claim 1, wherein the filter time constant is programmable responsive to a stimulus external to the system.

5. The system of claim 1, wherein the filter time constant is set based on historical output of the measurement circuit.

6. The system of claim 1, wherein the system includes a control circuit configured to, based on an output of the filter, perform at least one of the following: (a) disable sensing of interaction of the mechanical member with the resistive-inductive-capacitive sensor; (b) re-assign functionality of the resistive-inductive-capacitive sensor to another sensor for detecting human interaction; (c) modify a detection threshold magnitude for the displacement wherein a comparison of the displacement to the detection threshold magnitude is indicative of an actual human interaction with the mechanical member; (d) modify a Q factor of the resistive-inductive-capacitive sensor; (e) modify measurement sensitivity of the measurement circuit; and (f) modify a driving frequency at which the resistive-inductive-capacitive sensor is driven.

7. The system of claim 1, wherein the system is further configured to combine an output of the filter with an output of a loop filter integral to the measurement circuit to compensate for measurement signal phase shifts occurring responsive to change in the displacement.

8. The system of claim 1, wherein the system includes a control circuit configured to, based on an output of the filter, perform at least one of the following: (a) modification of a phase measurement algorithm of the measurement circuit, (b) modification of one or more calibration parameters of the measurement circuit, and (c) modification of an algorithm for detecting the displacement.

9. The system of claim 1, wherein the filter is implemented by a slope-detection subsystem and the changes to the displacement which are slower than the predetermined reference time are those changes having a slope with respect to time lower than a threshold slope.

10. The system of claim 1, wherein the predetermined reference time is based on a time associated with a human interaction with the mechanical member.

11. The system of claim 1, wherein: the different virtual button is a virtual volume button; the second filter time constant is associated with actuating the virtual volume button to control volume; and a third filter time constant is associated with actuating the virtual volume button to initiate a different action.

12. A method comprising: generating a voltage oscillation signal; phase shifting the voltage oscillation signal; converting the phase shifted voltage oscillation signal to a current signal; driving a resistive-inductive-capacitive sensor with the current signal; measuring phase information associated with the resistive-inductive-capacitive sensor being driven by the current signal; based on the phase information, determining a displacement of a mechanical member relative to the resistive-inductive-capacitive sensor, wherein the mechanical member is disposed within a planar region, and wherein the displacement is a displacement along an axis perpendicular to the planar region; and isolating, with a filter having a filter time constant that is larger than a predetermined reference time, changes to the displacement which are slower than the predetermined reference time, wherein the filter time constant is programmable based on an external stimulus such that different filter time constants are associated with different functionalities for the mechanical member, wherein a first filter time constant is associated with actuating a virtual power button, and wherein a second filter time constant is associated with actuating a different virtual button.

13. The method of claim 12, wherein isolating with the filter comprises isolating the changes to the displacement which are slower than the predetermined reference time to distinguish between false human interactions with the mechanical member and actual human interactions with the mechanical member.

14. The method of claim 12, wherein isolating with the filter comprises isolating changes to the displacement which are slower than the predetermined reference time to determine a permanent loss of functionality of the ability of the resistive-inductive-capacitive sensor to detect the displacement.

15. The method of claim 12, wherein the filter time constant is programmable responsive to a stimulus external to the system.

16. The method of claim 12, wherein the filter time constant is set based on historical output of the measurement circuit.

17. The method of claim 12, further comprising, based on an output of the filter, performing at least one of the following: (a) disabling sensing of interaction of the mechanical member with the resistive-inductive-capacitive sensor; (b) re-assigning functionality of the resistive-inductive-capacitive sensor to another sensor for detecting human interaction; (c) modifying a detection threshold magnitude for the displacement wherein a comparison of the displacement to the detection threshold magnitude is indicative of an actual human interaction with the mechanical member; (d) modifying a Q factor of the resistive-inductive-capacitive sensor; (e) modifying measurement sensitivity of the measurement circuit; and (f) modifying a driving frequency at which the resistive-inductive-capacitive sensor is driven.

18. The method of claim 12, further comprising combining an output of the filter with an output of a loop filter integral to the measurement circuit to compensate for measurement signal phase shifts occurring responsive to change in the displacement.

19. The method of claim 12, further comprising, based on an output of the filter, performing at least one of the following: (a) modification of a phase measurement algorithm of the measurement circuit, (b) modification of one or more calibration parameters of the measurement circuit, and (c) modification of an algorithm for detecting the displacement.

20. The method of claim 12, wherein the filter is implemented by a slope-detection subsystem and the changes to the displacement which are slower than the predetermined reference time are those changes having a slope with respect to time lower than a threshold slope.

21. The method of claim 12, wherein the predetermined reference time is based on a time associated with a human interaction with the mechanical member.

* * * * *